(12) United States Patent
Miyazawa

(10) Patent No.: US 6,542,368 B2
(45) Date of Patent: Apr. 1, 2003

(54) HEAT SINK AND POWER SOURCE UNIT EMPLOYING THE SAME

(75) Inventor: Yoshihide Miyazawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/962,142

(22) Filed: Sep. 26, 2001

(65) Prior Publication Data

US 2002/0041488 A1 Apr. 11, 2002

(30) Foreign Application Priority Data

Oct. 5, 2000 (JP) ........................................ 2000-305626

(51) Int. Cl.[7] ............................................... H05K 7/20
(52) U.S. Cl. ....................... 361/704; 361/707; 361/709; 361/714; 361/816; 257/706; 257/712; 174/16.3; 174/252; 165/80.3; 165/185
(58) Field of Search .................... 361/688, 702–704, 361/707, 709, 715, 719, 816, 818, 820; 257/683, 706, 712, 722; 174/16.1, 16.3, 17 R, 50.5, 50.51, 52.1, 52.3; 165/80.3, 185

(56) References Cited

U.S. PATENT DOCUMENTS

| | | | | |
|---|---|---|---|---|
| 4,717,990 A | * | 1/1988 | Tugcu | 361/816 |
| 5,272,593 A | * | 12/1993 | Jakob et al. | 361/707 |
| 5,461,542 A | * | 10/1995 | Kosak et al. | 361/710 |
| 5,526,232 A | * | 6/1996 | Kolberg et al. | 361/715 |
| 5,552,961 A | * | 9/1996 | Van Gaal et al. | 361/700 |
| 5,585,671 A | * | 12/1996 | Nagesh et al. | 257/697 |
| 5,744,860 A | * | 4/1998 | Bayerer | 257/683 |
| 5,801,330 A | * | 9/1998 | Gademann et al. | 174/52.1 |
| 5,811,790 A | * | 9/1998 | Endo et al. | 250/208.1 |
| 5,940,272 A | * | 8/1999 | Emori et al. | 361/704 |
| 6,104,611 A | * | 8/2000 | Glover et al. | 361/700 |
| 6,212,070 B1 | * | 4/2001 | Atwood et al. | 361/704 |
| 6,243,262 B1 | * | 6/2001 | Koo et al. | 361/687 |
| 6,282,092 B1 | * | 8/2001 | Okamoto et al. | 361/704 |
| 6,313,525 B1 | * | 11/2001 | Sasano | 257/704 |

FOREIGN PATENT DOCUMENTS

| | | | | |
|---|---|---|---|---|
| JP | 405110284 A | * | 4/1993 | 361/704 |
| TW | 388603 | | 4/2000 | |

* cited by examiner

*Primary Examiner*—Boris Chervinsky
(74) *Attorney, Agent, or Firm*—Sughrue Mion, PLLC

(57) ABSTRACT

A heat sink and a power source unit employing the same can minimize leakage of plosive outside of the power source unit upon failure of semiconductor parts and can restrict leakage of flashing, odor, smoke and so forth which is possibly caused upon occurrence of failure of the semiconductor parts. The heat sink has a heat radiating casing housing therein a semiconductor part forming a power source unit therein and whereby sealing the semiconductor part within the casing.

14 Claims, 3 Drawing Sheets

HEAT SINK AND POWER SOURCE UNIT EMPLOYING THE SAME

BACKGROUND OF THE INVENTION

1. Field of the Invention

The present invention relates to a power source used for a computer or the like. More particularly, the invention relates to a heat sink and a power source unit employing the same which can minimize leakage of plosive outside of the power source unit upon failure of semiconductor parts.

2. Description of the Related Art

In the power source unit to be used in computers or the like, a switching MOSFET which is a semiconductor part frequently causing failure, is employed. Since the switching MOSFET operates at high voltage and high power, a large amount of plosive and momentary sparks can be caused upon occurrence of failure of the MOSFET. In order to adapt to such failure, the power source unit is designed not to cause fire on the basis of safety standard.

FIG. 3 is a perspective view of the conventional type heat sink. The heat sink 1 shown in FIG. 3 is formed with a flat plate 1a of aluminum with a plurality of fins 1b. The heat sink 1 thus constructed is mounted so that it extends substantially perpendicular to planes of a printed circuit board. A semiconductor part 3, such as a switching MOSFET, is secured on an aluminum plate 2 at back surface portion for performing cooling by radiating heat of the semiconductor part 3 by the heat sink 1.

In case of the power source unit using the heat sink 1, the semiconductor part per se is mounted on the printed circuit board in bare condition within the power source unit. Since the power source unit is cooled by air, ventilation opening is formed in a casing. On the other hand, in case of the computer or the like, since the power source unit is mounted at a position facing outside of a main body, the semiconductor part (switching MOSFET) of the power source unit cannot be said as being shielded.

Therefore, since the switching MOSFET caused failure at high frequency, burst is caused in the switching MOSFET, plosive should directly cause leakage to outside of the main body. Then, user may hear a large amount of plosive, may see momentary sparks flying out or smoke flowing out of the computer or the like, or may smell odor to cause serious discomfort for the user. Nowadays, concern for product liability is growing, even though occurrence of sparks does not lead to occurrence of fire actually, such failure may cause degradation of credibility to result in re-calling of whole products.

SUMMARY OF THE INVENTION

The present invention has been worked out in view of the problems set forth above. It is therefore an object of the present invention to provide a heat sink can minimize leakage of plosive outside of the power source unit upon failure of semiconductor parts and can restrict leakage of flash, odor, smoke and so forth which is possibly caused upon occurrence of failure of the semiconductor parts, and a power source unit employing such heat sink.

According to the first aspect of the present invention, a heat sink comprises:

a heat radiating casing housing therein a semiconductor part forming a power source unit therein, and whereby sealing the semiconductor part within the casing.

In the preferred construction, fins may be provided on an outer surface of the casing. The semiconductor part may be mounted on the inner surface of the casing. The casing may be mounted on a printed circuit board and the semiconductor part is connected to the printed circuit board. At least one of side walls of the casing may be formed with a nonflammable transparent plate. The semiconductor part may generate plosive upon failure of semiconductor part. In this case, a sound deadening sheet of nonflammable material may be fitted on an inner surface of the casing.

According to the second aspect of the present invention, a power source unit comprises a heat sink constructed as set forth above. Namely, the power source unit includes a box shaped heat sink housing therein a semiconductor part forming a power source unit therein, and whereby sealing the semiconductor part within the heat sink.

As set forth above, with the heat sink and the power source unit employing the same seals the semiconductor part, such as switching MOSFET with the box shaped heat sink to insulate from the outside of the heat sink. Therefore, even when failure is caused in the semiconductor part, plosive thus generated can be suppressed within the heat sink so as not to reach a user's ears, and flash, foreign odor, smoke and so forth will never leak out. Thus, failure of semiconductor part will never provoke anxiety of the user.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
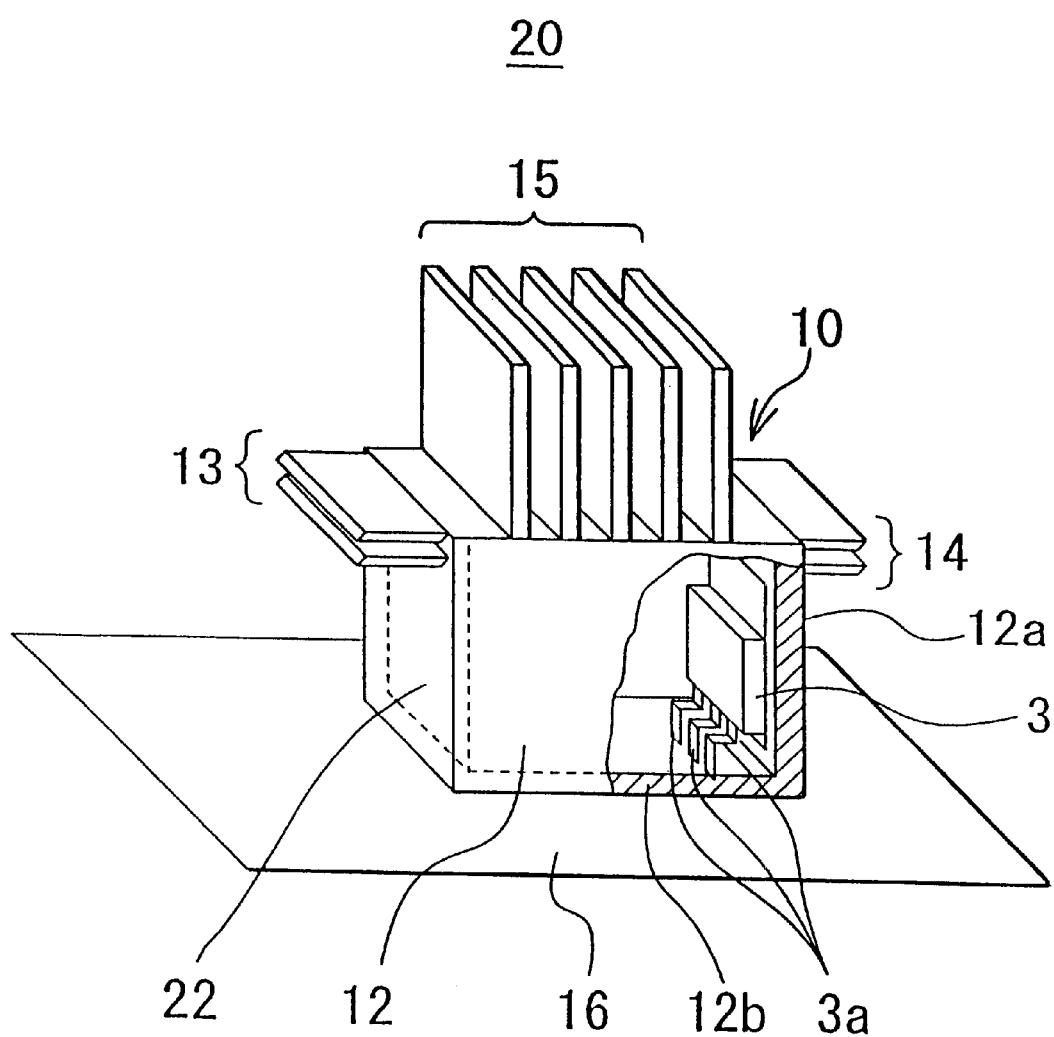
FIG. 1 is a perspective view of the first embodiment of a heat sink and a power source unit employing the same according to the present invention.

FIG. 1 shows the first embodiment of a heat sink and a power source unit employing the same according to the present invention. A heat sink 10 has a radiation casing 12 of the shape curving the inside of a cubic aluminum block. On outer surfaces of an upper wall and side walls of the casing 12, a plurality of heat radiation fins 13, 14 and 15 are provided.

A switching MOSFET 3 as semiconductor part forming the power source unit 20 is stored within the casing 12 with securing the back surface thereof on the inner surface of the side wall 12a of the casing 12. Thus, the switching MOSFET 3 is sealed within the casing 12. On the other hand, a terminal 3a of the switching MOSFET 3 extends through a bottom wall 12b of the casing 12.

The casing 12 housing the switching MOSFET 3 in a manner set forth above is secured on a printed circuit board (PCB) 16 with firmly fitting the bottomwall 12b on the printed circuit board 16. Also, the switching MOSFET 3 has the terminal 3a connected to the printed circuit board 16. With all of these components, a power source unit 20 is constructed.

It should be noted that it is possible to provide holes in the casing 12 or the fins 13, 14 and 15 for securing the switching MOSFET 3 within the casing 12 from outside of the casing 12. On the other hand, upon securing the bottom wall 12b of the casing 12 on the printed circuit board 16, compound or the like may be used for enhancing firmness.

By fitting a sound deadening sheet 22 of nonflammable material on the inner surface of the casing, plosive to be generated upon bursting of the switching MOSFET 3 will never reverb to enhance noise insulation effect.

With the power source unit shown in FIG. 1, a heat from the switching MOSFET as the semiconductor part is transmitted from the casing 12 of the heat sink to the fins 13, 14 and 15, and is radiated to the ambient air through the outer surface of the casing 12 and the fins 13. 14 and 15 by a not shown forced air cooling means (e.g. air cooling fan) provided in a computer system or the like, for example. Therefore, when sufficient surface area for heat radiation is provided in the heat sink 10 by the fins 13, 14 and 15 and so forth, no problem will be arisen even when the switching MOSFET 3 is sealed within the casing 12. Also, the switching MOSFET 3 can be protected against an external impact from outside of the power source unit 20 by the heat sink 10 and the printed circuit board 16.

On the other hand, upon occurrence of failure of the switching MOSFET 3, the switching MOSFET 3 may generate a large amount of plosive, damage a mold portion or element portion and may cause flashing, foreign odor or smoking. However, plosive is insulated by the casing 12 of the heat sink 10 and thus is prevented from casing leakage. Also, external leakage of flash, foreign odor or smoking can also be avoided successfully.

In the embodiment shown in FIG. 1, since the switching MOSFET 3 is sealed by the aluminum heat sink 10, the switching MOSFET 3 cannot be checked directly from outside of the heat sink. Therefore, in the second embodiment shown in FIG. 2, a nonflammable transparent plate 18 is provided in at least one side wall among side walls of the casing 12 of the heat sink 10 so that the switching MOSFET 3 in the casing may be checked from outside.

Figure 2:
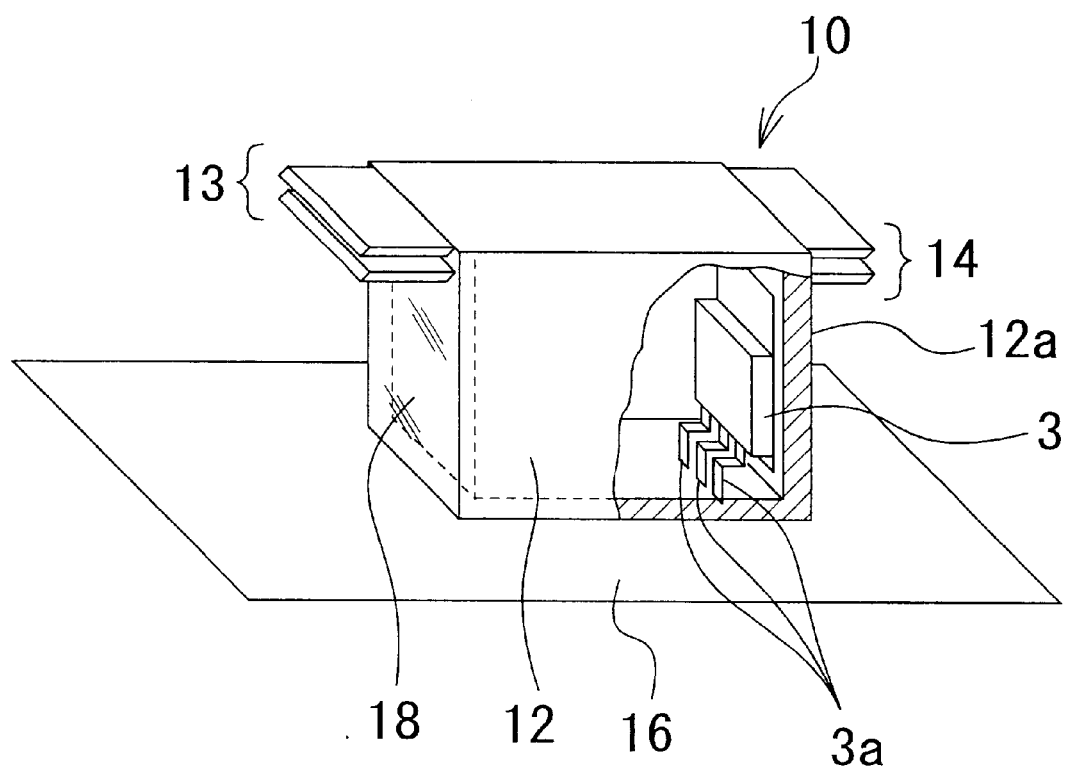
FIG. 2 is a perspective view of the second embodiment of a heat sink and a power source unit employing the same according to the present invention.
Figure 3:
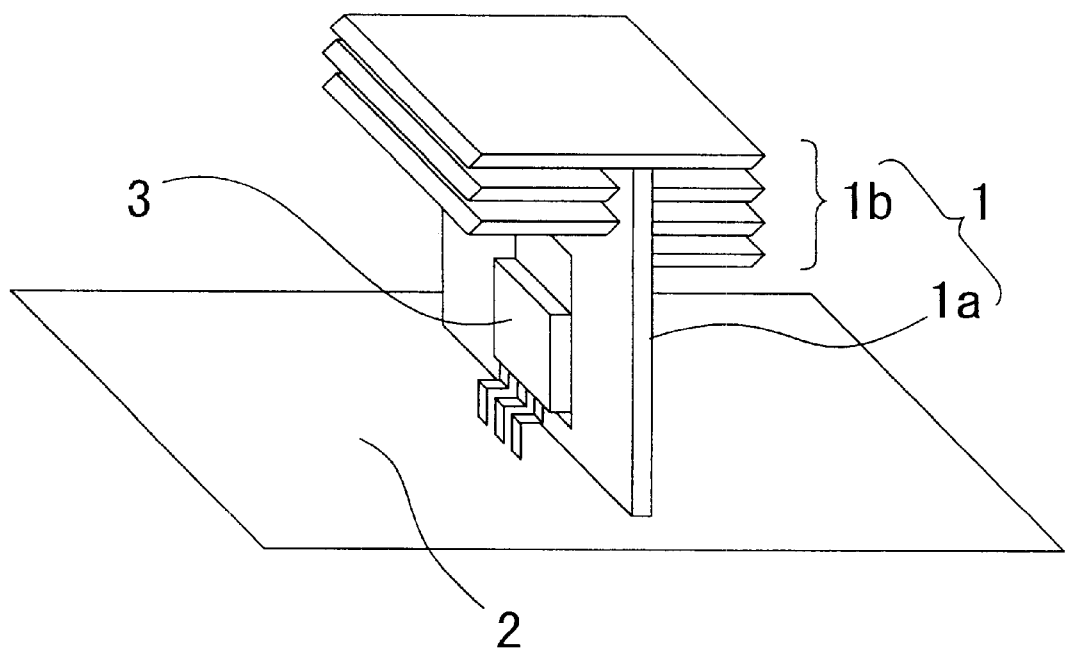
FIG. 3 is a perspective view of the prior art.

It should be noted that while the fins on the upper surface of the casing 12 of the heat sink 10 in FIG. 2 is eliminated, position, number and shape of the fins may be appropriately selected. On the other hand, number, position, shape and so forth of other components should not be limited to those in the shown embodiments, but can be of any number, position, shape and so forth suitable for implementing the present invention. Therefore, although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

With the present invention set forth above, since the semiconductor parts, such as switching MOSFET or the like, are sealed by the casing to insulate from the outside of the casing, plosive to be generated upon failure of the semiconductor parts can be restricted within the heat sink to suppressed from reaching to the user's ears. Also, since flash, foreign odor, smoke or the like will never leaks out of the casing, failure will never provoke anxiety of the user.

What is claimed is:

1. A heat sink comprising:

a heat radiating casing;

a semiconductor part that is sealingly housed within said heat radiating casing; and a sound deadening sheet of nonflammable material that is fitted on an inner surface of said heat radiating casing.

2. A heat sink as set forth in claim 1, wherein fins are provided on an outer surface of said casing.

3. A heat sink as set forth in claim 1, wherein said semiconductor part is mounted on an inner surface of said casing.

4. A heat sink as set forth in claim 1, wherein at least one of side walls of said casing is formed with a nonflammable transparent plate.

5. A heat sink as set forth in claim 1, wherein said semiconductor part generates plosive upon failure of said semiconductor part.

6. A heat sink comprising:

a heat radiating casing;

a semiconductor part that is sealingly housed within said heat radiating casing;
     wherein said semiconductor part is mounted on an inner surface of said heat radiating casing, and a sound deadening sheet of nonflammable material that is fitted on an inner surface of said heat radiating casing.

7. A heat sink comprising:

a heat radiating casing;

a semiconductor part that is sealingly housed within said heat radiating casing,
     wherein said semiconductor part generates plosive upon failure of said semiconductor part, and a sound deadening sheet of nonflammable material that is fitted on an inner surface of said heat radiating casing.

8. A power source unit comprising:

a box shaped heat sink;

a semiconductor part that is sealingly housed within said heat sink; and a sound deadening sheet of nonflammable material that is fitted on an inner surface of said heat sink.

9. A power source unit as set forth in claim 8, wherein fins are provided on an outer surface of said heat sink.

10. A power source unit as set forth in claim 8, wherein said semiconductor part is mounted on an inner surface of said heat sink.

11. A power source unit as set forth in claim 8, wherein at least one of side walls of said heat sink is formed with a nonflammable transparent plate.

12. A power source unit as set forth in claim 8, wherein said semiconductor part generates plosive upon failure of semiconductor part.

13. A power source unit comprising:

a box shaped heat sink;

a semiconductor part that is sealingly housed within said heat sink,
     wherein said semiconductor part is mounted on an inner surface of said heat sink, and a sound deadening sheet of nonflammable material that is fitted on an inner surface of said heat sink.

14. A power source unit comprising:

a box shaped heat sink;

a semiconductor part that is sealingly housed within said heat sink, wherein said semiconductor part generates plosive upon failure of said semiconductor part, and a sound deadening sheet of nonflammable material that is fitted on an inner surface of said heat sink.

* * * * *